(12) United States Patent
Berben et al.

(10) Patent No.: US 8,330,348 B2
(45) Date of Patent: Dec. 11, 2012

(54) STRUCTURED LUMINESCENCE CONVERSION LAYER

(75) Inventors: Dirk Berben, Taufkirchen (DE); Homer Antoniadis, Mountain View, CA (US); Frank Jermann, Koenigsbrunn (DE); Benjamin Claus Krummacher, Regensburg (DE); Norwin Von Malm, Nittendorf (DE); Martin Zachau, Geltendorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 307 days.

(21) Appl. No.: 12/092,075

(22) PCT Filed: May 19, 2006

(86) PCT No.: PCT/EP2006/004777
§ 371 (c)(1), (2), (4) Date: Aug. 5, 2008

(87) PCT Pub. No.: WO2007/051499
PCT Pub. Date: May 10, 2007

(65) Prior Publication Data
US 2008/0284313 A1 Nov. 20, 2008

Related U.S. Application Data

(63) Continuation-in-part of application No. 11/264,516, filed on Oct. 31, 2005, now Pat. No. 7,420,323, and a continuation-in-part of application No. 11/345,795, filed on Feb. 1, 2006, now Pat. No. 7,321,193.

(51) Int. Cl.
*H01J 1/72* (2006.01)
*H01J 1/62* (2006.01)
*H01J 9/227* (2006.01)

(52) U.S. Cl. .................. 313/501; 313/502; 313/506

(58) Field of Classification Search ........... 313/497–512; 315/169.3, 169.4; 257/40, 79; 428/690, 428/917
See application file for complete search history.

(56) References Cited

U.S. PATENT DOCUMENTS

| | | | |
|---|---|---|---|
| 6,479,930 B1 | 11/2002 | Tanabe et al. | |
| 6,939,189 B2 | 9/2005 | Wu et al. | |
| 7,088,043 B2 | 8/2006 | Min et al. | |
| 7,321,193 B2 | 1/2008 | Antoniadis et al. | |

(Continued)

FOREIGN PATENT DOCUMENTS

EP    0 973 358 A2    1/2000

(Continued)

OTHER PUBLICATIONS

Anil R. Duggal et al., "Organic Light-Emitting Devices for Illumination Quality White Light", May 13, 2002, Applied Physics Letters, vol. 80, No. 19, pp. 3470-3472.

(Continued)

*Primary Examiner* — Anh Mai
*Assistant Examiner* — Elmito Breval
(74) *Attorney, Agent, or Firm* — Fish & Richardson P.C.

(57) ABSTRACT

An apparatus device such as a light source is disclosed which has an OLED device and a structured luminescence conversion layer deposited on the substrate or transparent electrode of said OLED device and on the exterior of said OLED device. The structured luminescence conversion layer contains regions such as color-changing and non-color-changing regions with particular shapes arranged in a particular pattern.

43 Claims, 7 Drawing Sheets

U.S. PATENT DOCUMENTS

| | | | |
|---|---|---|---|
| 2001/0026124 A1 | 10/2001 | Liu et al. | |
| 2001/0030326 A1 | 10/2001 | Reeh et al. | |
| 2001/0033135 A1 | 10/2001 | Duggal et al. | |
| 2002/0063517 A1 | 5/2002 | Hosokawa | |
| 2003/0020399 A1 | 1/2003 | Moller et al. | |
| 2003/0111955 A1 | 6/2003 | McNulty et al. | |
| 2003/0164679 A1 | 9/2003 | Hamano et al. | |
| 2003/0218420 A1 | 11/2003 | Zovko | |
| 2003/0230753 A1 | 12/2003 | Steckl et al. | |
| 2004/0046497 A1 | 3/2004 | Schaepkens et al. | |
| 2004/0058613 A1 | 3/2004 | Hofmann et al. | |
| 2004/0061136 A1 | 4/2004 | Tyan et al. | |
| 2004/0135502 A1* | 7/2004 | Kobayashi et al. | 313/506 |
| 2004/0145308 A1 | 7/2004 | Rossner et al. | |
| 2004/0189185 A1 | 9/2004 | Yotsuya | |
| 2004/0212296 A1 | 10/2004 | Nakamura et al. | |
| 2004/0217702 A1 | 11/2004 | Garner et al. | |
| 2005/0023967 A1 | 2/2005 | Gotoh et al. | |
| 2005/0026530 A1 | 2/2005 | Toguchi et al. | |
| 2005/0029513 A1 | 2/2005 | Kawashima et al. | |
| 2005/0116621 A1* | 6/2005 | Bellmann et al. | 313/503 |
| 2005/0142379 A1 | 6/2005 | Juni et al. | |
| 2005/0181232 A1 | 8/2005 | Ricks et al. | |
| 2006/0097295 A1* | 5/2006 | Kim | 257/292 |
| 2006/0186802 A1 | 8/2006 | Cok et al. | |
| 2007/0046161 A1 | 3/2007 | Haenichen et al. | |
| 2007/0096634 A1 | 5/2007 | Krummacher | |

FOREIGN PATENT DOCUMENTS

| | | |
|---|---|---|
| EP | 1 555 854 | 7/2005 |
| JP | 03-152897 | 6/1991 |
| JP | 11-121164 | 4/1999 |
| JP | 2000-082587 | 3/2000 |
| JP | 2001-148287 | 5/2001 |
| JP | 2003-115377 | 4/2003 |
| JP | 2004-303562 | 10/2004 |
| KR | 2001-0070934 | 7/2001 |
| WO | WO 2004/040661 A2 | 5/2004 |

OTHER PUBLICATIONS

A. Niko et al., "Red-green-blue emission or paranexaphenyl devices with color-converting media", Nov. 1997, Journal of Applied Physics, vol. 82, No. 9, pp. 4177-4182.

Shigeo Shinoya et al., "Phosphor Handbook", 1999, CRC Press LLC, pp. 736-738.

J. J. Shiang et al., "Application of radiative transport theory to light extraction from organic light emitting diodes", Mar. 1, 2004, Journal of Applied Physics, vol. 95, No. 5, pp. 2880-2888.

W. H. Melhuish, "Quantum Efficiencies of Fluorescence of Organic Substances: Effect of Solvent and Concentration of the Flourescent Solute", Feb. 1961, Journal of Phys. Chem. 65, pp. 229-235.

International Standard, "Representation of results of particle size analysis—Part 2: Calculation of average particle sizes/diameters and moments from particle size distributions", Apr. 1, 2001, ISO 9276, First Edition, 20 pp.

International Search Report and Written Opinion of the International Search Authority, International Application Serial No. PCT/EP2006/004777, Sep. 21, 2006, 8 pp.

International Preliminary Report on Patentability, International Application Serial No. PCT/EP2006/004777, May 15, 2008, 7 pp.

English Translation of Official Letter and Search Report received from Taiwan Patent Office for Application No. 95139133, dated Aug. 27, 2009, 4 pages.

Japanese Examination Report, Patent Application No. 2008-538261 dated Oct. 1, 2010, 7 pages.

Notice of Office Action from the Korean Intellectual Property Office with regard to Korean Application No. 10-2008-7013248 dated Jun. 25, 2012.

\* cited by examiner

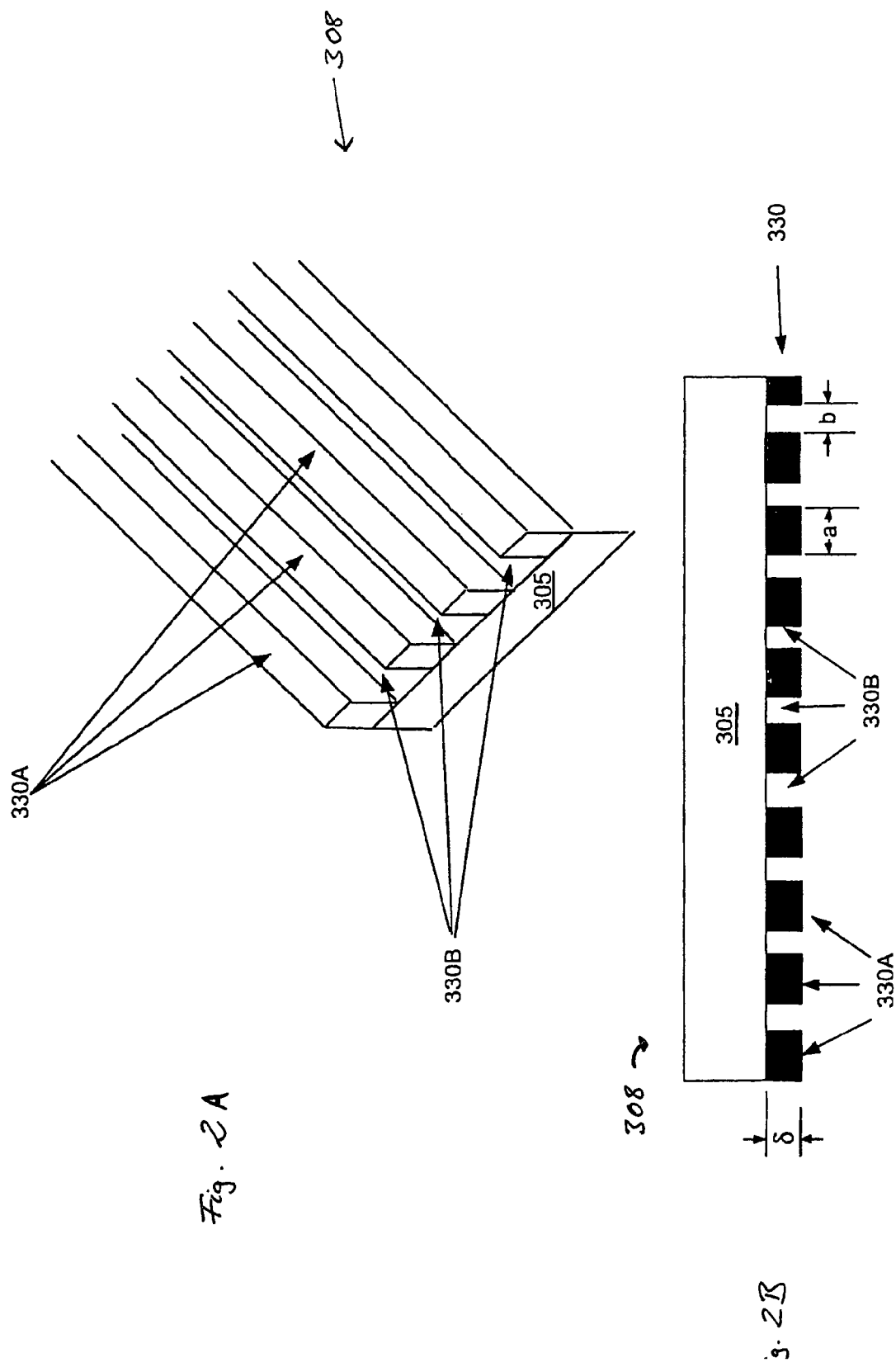

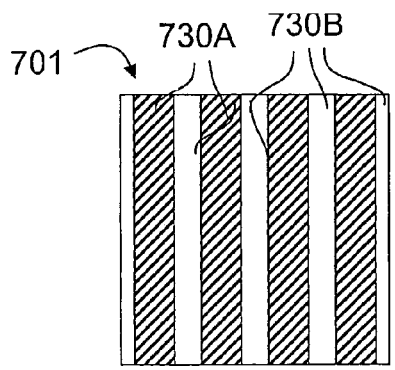
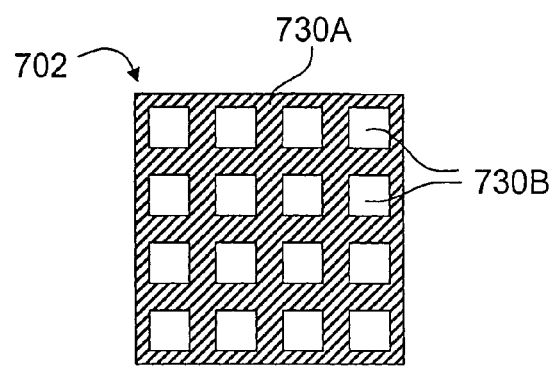
FIG. 4A
FIG. 4B
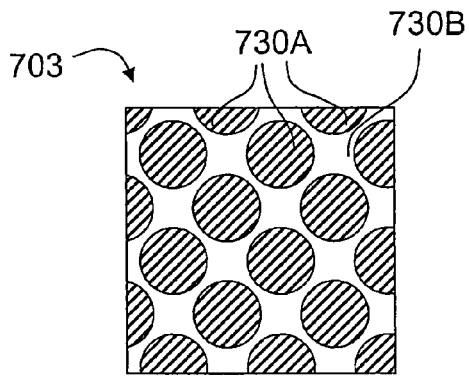
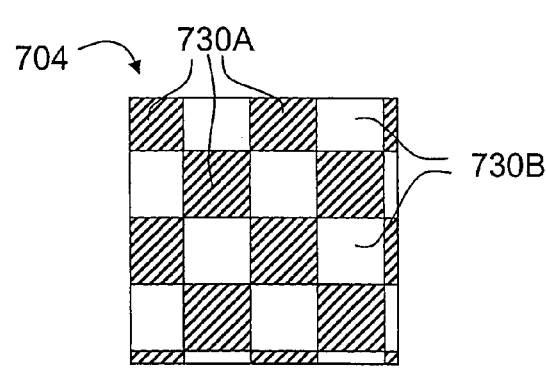
FIG. 4C
FIG. 4D
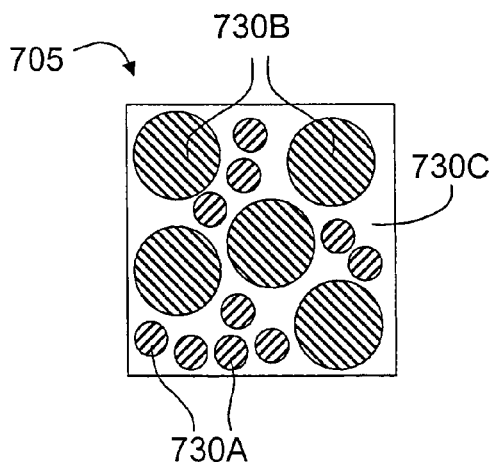
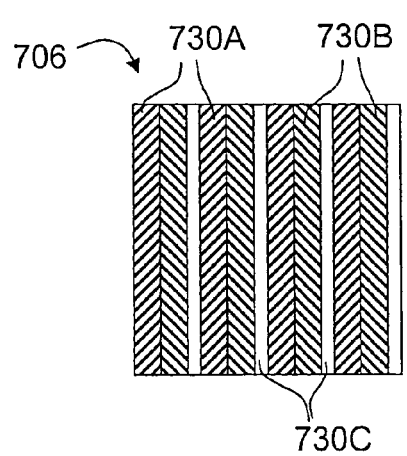
FIG. 4E
FIG. 4F

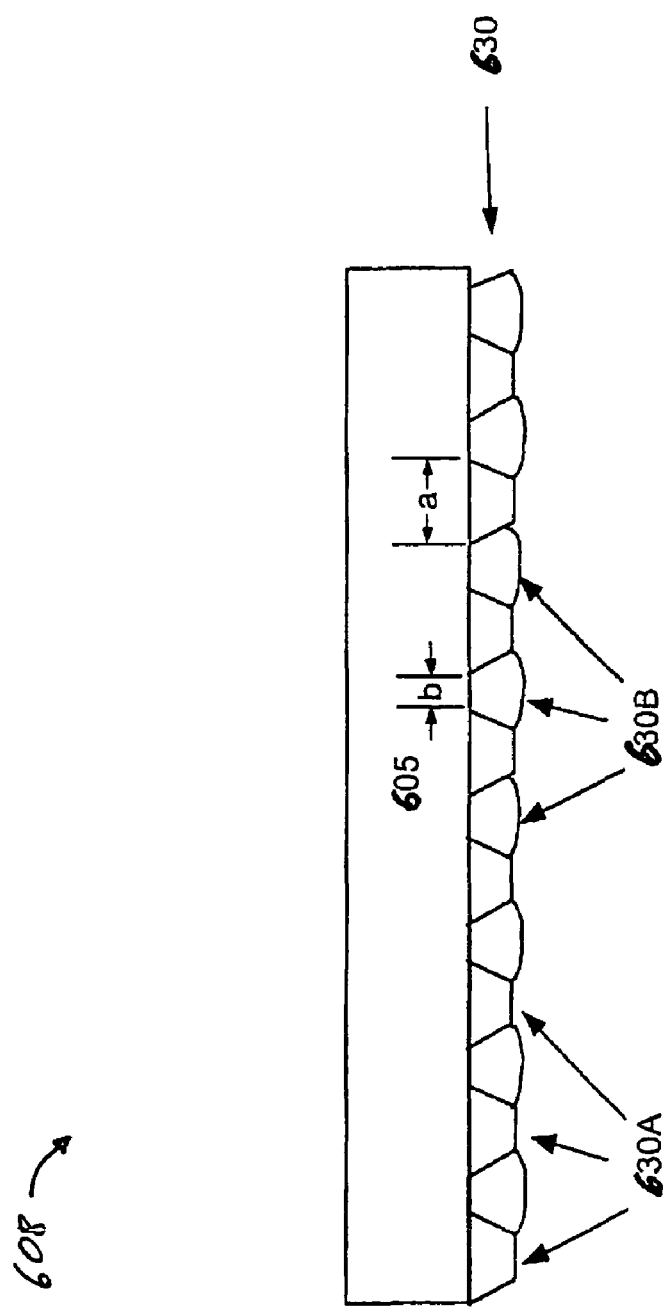

STRUCTURED LUMINESCENCE CONVERSION LAYER

PRIORITY CLAIMS

This application is a National Stage of International Application PCT/EP2006/004777, filed May 19, 2006, which is a continuation-in-part of U.S. patent application Ser. No. 11/264,516, filed Oct. 31, 2005, and which is also a continuation-in-part of U.S. patent application Ser. No. 11/345,795, filed Feb. 1, 2006, now U.S. Pat. No. 7,321,193.

GOVERNMENT RIGHTS

Part of the invention was made with Government support under Contract No. DE-FC26-04NT41947 awarded by the Department of Energy. The Government may have certain rights in the invention.

BACKGROUND

Display and lighting systems based on light emitting diodes ("LEDs") have a variety of applications. Such display and lighting systems are designed by arranging a plurality of photo-electronic elements ("elements") such as rows of individual LEDs. LEDs that are based upon semiconductor technology have traditionally used inorganic materials, but recently, the organic LED ("OLED") has become a potential substitute. Examples of other elements/devices using organic materials include organic solar cells, organic transistors, organic detectors, and organic lasers.

An OLED typically comprises two or more thin organic layers (e.g., an electrically conducting organic layer and an emissive organic layer which emits light) which separate an anode and a cathode layer. Under an applied forward potential, the anode injects holes into the stack of organic layers, while the cathode injects electrons. The injected holes and electrons each migrate (under the influence of an externally applied electric field) toward the opposite electrode and recombine in the emissive layer under emission of a photon. Similar device structure and device operation applies for OLEDs consisting of small molecule organic layers and/or polymeric organic layers. Each of the OLEDs can be a pixel element in a passive/active matrix OLED display or a single element used as a general area light source or lighting element and the like.

The construction of OLED light sources and OLED displays from individual OLED elements or devices is well known in the art. The displays and light sources may have one or more common layers such as common substrates, anodes or cathodes and one or more common organic layers sandwiched in between. They may also consist of photo-resist or electrical separators, bus lines, charge transport and/or charge injection layers, and the like. Typically, a transparent or semi-transparent glass substrate is used in bottom-emitting OLED devices.

The mismatch of the refractive index between air and the OLED may lead to a significant part of the generated light being lost through total internal reflection into wave guiding modes and self absorption. Applying a phosphor layer or a scattering layer on the light emitting side of an OLED-device increases the output of OLEDs due to volumetric scattering mechanisms. Light extraction can also be improved by texturing the light emitting side of an OLED, for example by sand blasting or etching as described in a currently co-pending commonly assigned US patent application entitled "Using Prismatic Microstructured Films for Image Blending in OLEDs" filed on Aug. 29, 2005, bearing Ser. No. 11/215,548.

Furthermore, the quality of lighting is given by the color rendering index (CRI) of the light source. The CRI is a measurement of the light source (lighting device) to render all the colors of the object under illumination. The CRI depends on the normalized output spectrum of a lighting device. For many applications, light sources, which emit light in the short wave range, are coated with one or more layers of luminescence converting materials (down-conversion layers), i.e. color-changing materials, to form a higher-CRI light source compared to the uncoated light source.

A color-changing material coated on a light source absorbs a part of photons emitted by the light source and emits them at a different wavelength. A color-changing material is defined herein as a material which absorbs photons related to lower wavelength(s) and which remits all of them or a part of them (depending on the quantum yield of the color-changing material) at higher wavelength(s). The non-absorbed fraction of the photons emitted by the light source and the photons emitted by the color-changing material constitute the output spectrum of the coated device.

For lighting applications, cerium doped garnets, nitride phosphors, ionic phosphors like $SrGa_2S_4:Eu^{2+}$ or $SrS:Eu^{2+}$, fluorescent dyes, quantum dots or conjugated polymers are often used as luminescence converting materials. In most applications, these materials are dissolved or embedded in a transparent matrix, for example polycarbonate, silicone, epoxy or PMMA (polymethylmethacrylate). The matrix containing the color-changing material is often directly coated on the light source or used as material of the device housing.

The disadvantage of conventional uniform coatings is explained by the following example. For instance, consider one or more uniform down-conversion layers on top of a flat light source. The light output of the light source is below the photon saturation limit of the down-conversion layer(s). In this case the shape of the output spectrum of the device is only adjusted by the thickness value(s) of the layer(s) and the concentration(s) of the phosphor(s) in the matrix. The multitude of all possible output spectra is given by the variation of these concentrations or thickness values. Thus, there is limited flexibility in designing output spectra.

BRIEF DESCRIPTION OF THE DRAWINGS

FIGS. 2A-2B show a perspective and a cross-sectional view of an exemplary EL apparatus according to embodiments of the invention.

FIGS. 4A-4F illustrate exemplary patterns for structured luminescence conversion layers from a top view.

FIG. 6 shows a cross-sectional view of another exemplary EL apparatus in accordance with at least one embodiment of the invention.

DETAILED DESCRIPTION

Figure 1:
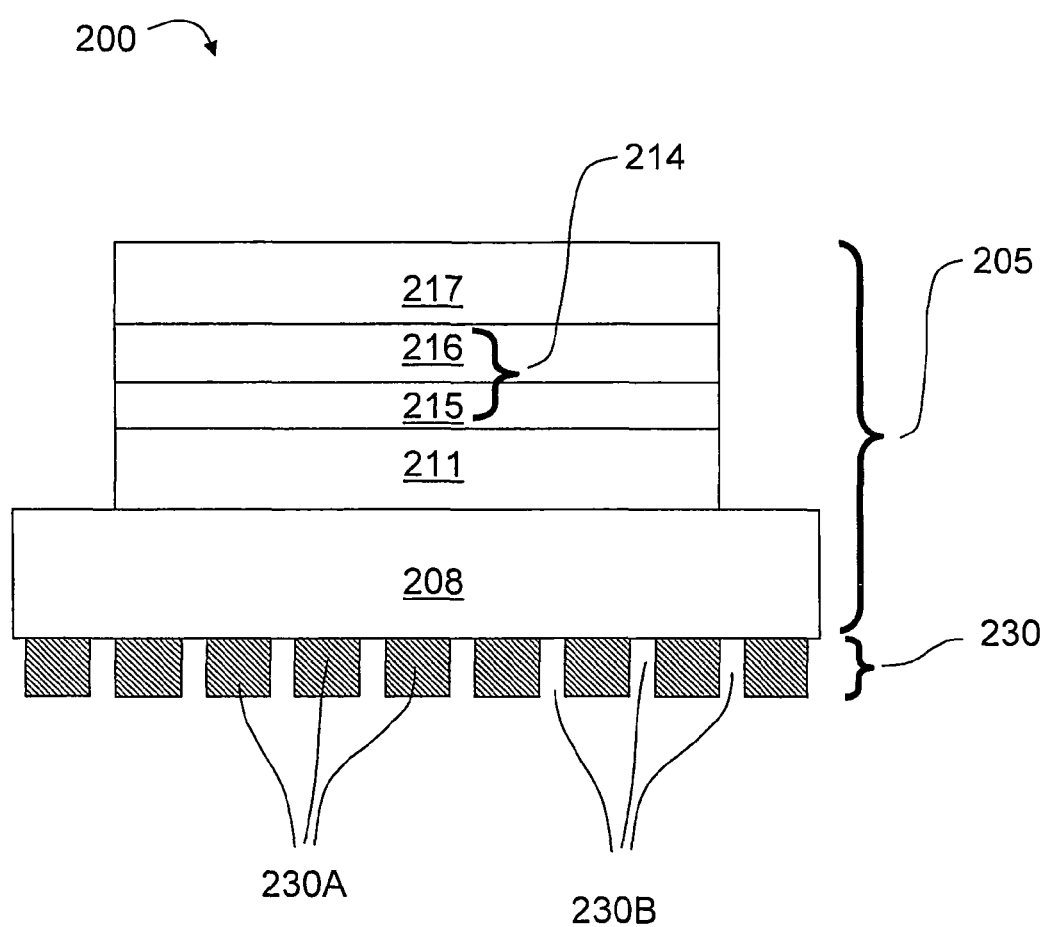
FIG. 1 shows a cross-sectional view of an embodiment of an electroluminescent (EL) apparatus according to at least one embodiment of the invention.

In at least one embodiment of the invention, an electroluminescent (EL) apparatus is disclosed which utilizes a light source comprising a transparent layer capable of at least partially transmitting light out from said light source; and a structured luminescence conversion layer disposed over said transparent layer, said structured luminescence conversion layer comprising first color-changing regions and second regions different from said first color-changing regions, said first color-changing regions absorbing a first spectrum of light from said light source and emitting a second spectrum of light, said second spectrum of light combining with the spectrum of light from said second regions to give a total output spectrum of light for said electroluminescent apparatus.

In at least one further embodiment of the invention the transparent layer is disposed in the path of light emission of the light source.

In at least one further embodiment of the invention the structured luminescence conversion layer is disposed on the exterior of the light source.

In at least one embodiment of the invention the light source is an OLED device.

In at least one embodiment of the invention the term "light" relates to electromagnetic radiation with a wavelength or a range of wavelengths, the wavelength or the range of wavelengths falling into a range of wavelengths which comprises ultraviolet, visible, and infrared electromagnetic radiation.

In at least one embodiment of the invention the term "spectrum" refers to a spectral distribution represented by a wavelength or a range of wavelengths forming spectral components of the spectrum, wherein the different spectral components may have different relative intensities. A first spectrum and a second spectrum are understood to be equal if the spectral components and the relative intensities of the spectral components are equal for the first and the second spectrum, respectively, whereas the absolute intensity of the first spectrum and the absolute intensity of the second spectrum may be different.

In at least one embodiment the structured luminescence conversion layer is attached physically and/or chemically to the transparent layer. This implies in particular that the structured luminescence conversion layer may be for example adhered by means of glue, preferably a transparent glue, or and index matching gel to the transparent layer or may comprise chemical, e.g. covalent, bonds to the transparent layer.

The structure of the structured luminescence conversion layer in accordance with various embodiments of the invention may comprise striped, cross-striped (meshed), circular-shaped, triangular-shaped, or square-shaped (checkered) regions or regions of any geometry in configuration or any combinations thereof. Further, the structure of the structured luminescence conversion layer may comprise irregular patterns of regions, in particular patterns including first color-changing and second regions with variable dimensions and shapes.

The dimensions of the regions, i.e. the resolution of the regions, of the structured luminescence conversion layer may be on the order of less than millimeters, more preferably on the order of 100 to several 100 micrometers, and even more preferably on the order of less than 100 micrometers. Especially for lighting applications where the EL apparatus is not used in combination with optical imaging techniques or devices the dimensions of the regions of the structured luminescence conversion layer may require only moderate restrictions.

In at least one embodiment of the invention a region of the structured luminescence conversion layer comprises a first surface (input surface) and a second surface (output surface), respectively. The light of the light source may enter the region via its input surface and may leave the region via its output surface. In particular, the input surface may be directed toward the light source while the output surface may be on the opposite side.

In at least one embodiment of the invention the structured luminescence conversion layer, which comprises first color-changing regions, further comprises second regions which may comprise or be non-color-changing regions.

In at least one embodiment of the invention the total output spectrum of light for the EL apparatus is given by the second spectrum of light emitted by the first color-changing regions combined with the non-absorbed spectrum of light, where the non-absorbed spectrum of light may be part of the second spectrum and may be the spectrum of light passed through the second, non-color-changing regions.

Furthermore, first color-changing regions may be separated by second regions, for instance various first color-changing regions or various pluralities of first color-changing regions may be separated by various non-color-changing regions or by various pluralities of non-color-changing regions, or various non-color-changing regions or various pluralities of non-color-changing regions may be separated by various first color-changing regions or by various pluralities of first color-changing regions.

In at least one embodiment of the invention the non-color-changing regions may be completely empty or void of material or may comprise non-absorbing, light emitting, non-color-changing, or light transmitting material or combinations thereof which does not significantly alter or re-emit the incident light in a different spectrum. The material may comprise glass, silicone, resin, e.g. epoxy or acrylic resin, polymers comprising for example polymethylmethacrylate, polycarbonate, polyethylene, polypropylene, polyamide, or polyimide, or any other suitable material or combinations thereof.

In at least one embodiment of the invention color-changing regions comprise color-changing material (such as a phosphor). Color-changing material is a material which can absorb light in one spectrum, which may preferably overlap at least partially with the first spectrum emitted by the light source, and emit light preferably with a high quantum yield in another, for instance a second, spectrum which is different from the first spectrum.

Exemplary color-changing material which could be used in forming the color-changing regions may be fluorescent and/or phosphorescent. It may include, but is not limited to, organic and inorganic dyes, garnets, preferably cerium doped garnets represented by the formula $A_3X_5O_{12}$:Ce (with A representing Y, Gd, or Tb; and X representing Al or Ga) and represented by the formula $Y_3X_5A_{12}$:Ce (with X representing Al or Si; and A representing O or N), orthosilicates, preferably represented by the formula $X_2SiO_4$:Eu (with X representing Sr, Ba, or Ca), nitrides, oxynitride silicates represented by the formula $XSi_2O_2N_2$:Eu (with X representing Sr, Ba, or Ca), nitride silicates like $Ca_2Si_5N_8$:Eu, $Sr_2SisN_8$:Eu, and $CaAlSiN_3$:Eu, ionic phosphors like $SrGa_2S_4$:$Eu^{2+}$ or $SrS$:$Eu^{2+}$, perylene, coumarin, quantum dots, fluorescent dyes, and conjugated polymers.

Furthermore, the particle size of the color-changing material may be smaller than the resolution of the structure of the structured luminescence conversion layer.

In at least one embodiment of the invention the color-changing material within the color-changing regions may be dissolved or blended or embedded in matrix material, which may be preferably transparent and non-light-absorbing, comprising for instance glass, silicone, resin like for example epoxy or acrylic resin, adhesive, polymers comprising for example polyethylene, polypropylene, polyamide, polymethylmethacrylate, polycarbonate, or polyimide, or any other suitable material or combinations thereof. Further, the structured luminescence conversion layer may comprise matrix material.

All of the color-changing regions in the structured luminescence conversion layer can be of the same material or can be of different material. For instance, one portion of the color-changing regions may be orange emitting while another portion is yellow emitting.

At least one color-changing region may comprise for instance scattering particles, phosphor particles and so on.

In at least one preferred embodiment of the invention the regions of the structured luminescence conversion layer are adjacent to one another. Thus, the regions of the structured luminescence conversion layer may not be stacked vertically, i.e. in the direction of the path of light emission, but rather each region may occupy a certain area on the exterior surface of the transparent layer of the light source, i.e. the regions may be arranged and structured laterally. The regions of the structured luminescence conversion layer further may be adjacent directly to the transparent layer.

The ratio of the surface area (or width or other dimension) of the first color-changing regions versus the second regions affects the output spectrum of the EL apparatus. Due to the addition of this ratio, the use of a structured conversion layer gives greater flexibility in designing the output spectra than when uniform conversions layers are used. The flexibility enables finding a better compromise between efficiency and color rendering.

According to a model described in A. R. Duggal, J. J. Shiang, C. M. Heller, D. F. Foust, Applied Physics Letters 80, 19 (2002), the output spectrum of an EL apparatus with a uniform down conversion or color-changing material layer is given by:

$$A_{\alpha,\delta}(\lambda)=S_0(\lambda)\exp[-\alpha(\lambda)\delta]+W_{\alpha,\delta}C_{\alpha,\delta}(\lambda)P(\lambda), \quad (1)$$

where $\alpha(\lambda)$ is the absorption coefficient of the luminescence conversion layer related to the color-changing material concentration, $\delta$ is the effective optical path length which may be related but not necessarily equal to the thickness of the layer (due to scattering and other geometrical effects). $P(\lambda)$ is normalized so that its integral over all wavelengths is unity. $W_{\alpha,\delta}$ is a weight factor. $C_{\alpha,\delta}(\lambda)$ is the self absorption correction. $S_0(\lambda)$ is the emission spectrum of the light source.

Based on the rules of color mixing, the output spectrum of an identical EL apparatus with a structured luminescence conversion layer comprising first color-changing regions which do not reach the photon saturation limit and second regions which are formed as non-color-changing regions in accordance with at least one embodiment of the invention is given by:

$$B_{\alpha,\delta,x}(\lambda)=(1-x)S_0(\lambda)+x[S_0(\lambda)\exp[-\alpha(\lambda)\delta]+W_{\alpha,\delta}C_{\alpha,\delta}(\lambda)P(\lambda)], \quad (2)$$

where $x$ (=0 ... 1) is related to the size and/or the configuration of the color-changing regions, and (1-x) is related to the size and/or the configuration of the non-color-changing regions of the structured luminescence conversion layer.

The weight factor $W_{\alpha,\delta}$ is given by:

$$W_{\alpha,\delta}=Q\int S_0(\lambda)(1-\exp[-\alpha(\lambda)\delta])d\lambda,$$

where Q is the quantum yield of the color-changing material used in the color-changing regions.

The self absorption correction $C_{\alpha,\delta}(\lambda)$ is given by:

$$C_{\alpha,\delta}(\lambda)=\exp[-\alpha(\lambda)\delta]/(1-Q\int P(\lambda)(1-\exp[-\alpha(\lambda)\delta])d\lambda).$$

The above assumes that the effective path length for the absorption process is equal to the effective path length for the luminescence. As a result of the model described in equation 2 above, the differentiation between color-changing regions (given by the multiplier x) and non-color-changing regions (given by the multiplier 1-x) enables a greater ability to tune the output spectra more precisely.

Discussions similar to the discussion given above apply to the case that the second regions are second color-changing regions, to the case that the second regions comprise second color-changing regions and non-color-changing regions as well as to the case that color-changing regions reach or even exceed the photon saturation limit.

In at least one further embodiment of the invention the second regions of the structured luminescence conversion layer comprise second color-changing regions, which are different form the first color-changing regions and which absorb at least part of light with a first spectrum emitted by the light source and emit light with a third spectrum. This implies that the structured luminescence conversion layer comprises first color-changing regions and second color-changing regions, where the spectrum of light emitted by the first color-changing regions is different from the spectrum of light emitted by the second color-changing regions. In particular, the second spectrum emitted by the first color-changing regions may include a wavelength or a range of wavelengths which is not included in the third spectrum emitted by the second color-changing regions and/or the third spectrum of the second color-changing regions may include a wavelength or a range of wavelengths which is not included in the second spectrum emitted by the first color-changing regions. Furthermore, the second regions may be second color-changing regions.

Further, the first color-changing regions may be separated by the second color-changing regions.

In at least one further embodiment of the invention the color-changing material selected for inclusion in at least one color-changing region of the structured luminescence conversion layer is such that the light output of the at least one color-changing region of the structured luminescence conversion layer is below the photon saturation limit.

In at least one embodiment of the invention the color-changing material selected for inclusion in all color-changing regions of the structured luminescence conversion layer is such that the light output of the color-changing regions is below the photon saturation limit.

In at least one embodiment of the invention the color-changing material selected for inclusion in at least one color-changing region of the structured luminescence conversion layer is such that the light output of the at least one color-changing region may reach or exceed the photon saturation limit.

In at least one embodiment of the invention the color-changing material selected for inclusion in all color-changing regions of the structured luminescence conversion layer is such that the light output of the color-changing regions may reach or exceed the photon saturation limit.

In at least one further embodiment of the invention the color-changing material is chosen in such a way that backscattering of the light emitted by the light source into the light source by the color-changing regions is minimized. Backscattering by color-changing material may occur in particular when the photon saturation limit is reached or exceeded. Furthermore, in order to minimize backscattering the size d50 of particles of the color-changing material may be preferably either at least 1500 nanometers or at most 300 nanometers. More preferably d50 may be at least 2000 nanometers, depending on the type of color-changing material and resin.

Particle size d50 is understood preferably as a number based average particle diameter, for example discussed in "Sh. Shionoya and W. M. Yen (eds.), Phosphor Handbook, CRC Press LLC (1999), p. 736-738" which is incorporated in its entirety by reference for all purposes, and more specifically a median equivalent spherical diameter size d50(Q0) according to German standard DIN 66141 corresponding to international standard ISO 9276-2 which is incorporated in its entirety by reference for all purposes.

In at least one further embodiment the first color-changing regions and/or second regions which comprise color-changing regions and/or non-color-changing regions may comprise structures which change the geometrical path of the incident light. In particular the structured luminescence conversion layer may comprise regions, for instance first and/or second regions, where the output surface has a certain geometrical shape. In particular an output surface may comprise spherical, aspherical, emboss-like, trapezoidal, or prismatic structures or parts of such structures or any combination thereof.

Furthermore, first regions may be formed as luminescence conversion elements, which may comprise an output surface with a certain shape. Second regions may be formed as light extraction elements, which may comprise an output surface with a certain shape. Further, first regions formed as luminescence conversion elements and second regions formed as light extraction element may form a multi-element light extraction and luminescence conversion region.

In at least one embodiment of the invention the structured luminescence conversion layer comprises a multi-element light extraction and luminescence conversion (MLELC) region comprising at least one light extraction element and at least one luminescence conversion element. The light extraction element may diffuse the light or at least part of the light from the light source. The luminescence conversion element comprises at least one first color-changing region which absorbs part of a first spectrum of light from the light source and emits a second spectrum of light.

In a preferred embodiment the MLELC region comprises a plurality of luminescence conversion elements and a plurality of light extraction elements.

In a further preferred embodiment of the invention a luminescence conversion element is a color-changing region.

The non-absorbed part of the first spectrum of light and the second spectrum of light from the at least one luminescence conversion element or the plurality of luminescence conversion elements combines with the diffused light output from the at least one light extraction element or the plurality of light extraction elements to give a total output spectrum.

A light extraction element of the MLELC layer may include at least one or a plurality of non-color-changing light transmitting regions.

Alternatively, a light extraction element may include at least one or a plurality of color-changing regions. In at least one embodiment of the invention the structured luminescence conversion layer comprises a plurality of MLELC regions or even forms a MLELC layer.

A discussion, similar to the discussion given above about the comparison of the output spectrum of an EL apparatus with a uniform down-conversion or color-changing material layer according to equation 1 and the output spectrum of an EL apparatus with a structured luminescence conversion layer according to equation 2, applies also to the case that the structured luminescence conversion layer comprises at least one MLELC region or even is a MLELC layer which comprises light extraction and luminescence conversion elements. In at least one preferred embodiment of the invention a light extraction element has a refractive index ($n_1$) equal or close to the refractive index of the transparent layer of the OLED device or light source, which may be adjacent to and may transmit light to the MLELC region or layer. The refractive index ($n_2$) of a luminescence conversion element may be designed to be less than $n_1$. The adjustment of the refractive index between air and elements of the MLELC region or MLELC layer may avoid that part of the generated light may be lost through total internal reflection into wave guiding modes and self absorption.

In at least one further preferred embodiment of the invention the shape of the light extraction element is trapezoidal or an emboss-type geometry.

In at least one further preferred embodiment of the invention the preferred shape of the luminescence conversion element is flat or lens-like.

In at least one further preferred embodiment of the invention the MLELC layer or the structured luminescence conversion layer comprises light extraction element(s) and/or luminescence conversion element(s) which comprise materials with a low absorption coefficient, in particular for the light emitted by the light source and the light emitted by the color-changing material, respectively.

In at least one embodiment the structured luminescence conversion layer comprises a substrate.

In at least one embodiment of the invention the EL apparatus is used for lighting applications. It may have lateral dimensions in the range of millimeters to several centimeters or even above centimeters.

In at least one embodiment of the invention the EL apparatus is flexible and is an electroluminescent foil.

In at least one embodiment of the invention regions of the structured luminescence conversion layer are fabricated by screen printing. Screen printing may typically reach a resolution of about 70 micrometers. This means in particular that for instance a spherical or spherical-like region can be manufactured with a minimum radius which is on the order of the resolution. Further it means in particular that for instance a stripe-shaped region may be fabricated with a minimum stripe width which is on the order of the resolution. Screen printing may be especially suitable for low-cost applications and may provide a good technical manageability.

In at least one embodiment of the invention regions of the structured luminescence conversion layer are fabricated by a lithographic technique, e.g. photolithography. The structure of a photoresist layer used in photolithography may provide a resolution of below 100 nanometers, thus a structured photoresist layer may provide voids with such resolution. For example a structured photoresist layer may be deposited on the transparent layer of the light source. The voids may define first regions and can be filled with color-changing material in order to form first regions that are color-changing regions. The filling of the voids can be done by a selective deposition technique or a non-selective deposition technique. In the case of a selective deposition technique different voids can be filled with different materials. Afterwards the structured photoresist layer may be removed and first regions remain on the transparent layer of the light source. After removing the photoresist layer second regions, which may be empty, separating the first regions appear. Second regions may stay empty or may be filled with transparent material in order to form second regions which are non-color-changing regions. Alternatively, second regions may be filled with color-changing material which is different from the color-changing material in the color-changing regions in order to form further, e.g. second, color-changing regions.

Alternatively, the voids in the photoresist layer can define second regions. The voids can be filled with color-changing and/or non-color-changing material in order to form second regions. After removing the photoresist layer the regions which are not second regions can be filled with color-changing material in order to form first regions which are color-changing regions.

In at least one embodiment of the invention photolithography technique is used to form first and/or second regions on a substrate. The substrate with color-changing regions may be attached to the light source for example by means of a transparent adhesive, a light-curable transparent adhesive, or an index matching gel.

In at least one embodiment of the invention color-changing material is dissolved in a foil material. The foil material may for instance comprise a polymer like polyethylene, polypropylene or any other suitable polymer or material. A specially shaped foil or pieces of foil are attached to the transparent layer of the light source forming first regions which are color-changing regions. This technique applies especially for low-cost applications where only a moderate resolution is required.

In at least one embodiment of the invention color-changing regions of the structured luminescence conversion layer may be fabricated by electrophoresis. In this procedure a structured transparent conductive layer may be deposited over the transparent layer of the light source. The structured transparent conductive layer may comprise a transparent conductive material like metal oxide, e.g. indium-tin oxide (ITO), or doped conducting polymers, or may be made of the transparent conductive material. Preferably the structured transparent conductive layer is made of ITO. The structured transparent layer may include structured transparent elements which form together the structured transparent layer. The structured transparent conductive layer or at least one structured transparent element may be used to apply an electric field. Due to the electric field color-changing material, preferably available in a liquid phase such as a liquid mixture or a solution, may be deposited or precipitated on the structured transparent conductive layer or on the at least one structured transparent element forming first regions which are color-changing regions. By applying an electric field to other structured transparent elements other color-changing material available in another liquid or solvent may be deposited or precipitated on the structured transparent elements forming second regions which are color-changing regions.

The resolution of this technique depends on the resolution of the structured transparent conductive layer. In particular, no binder or similar material may be needed as a matrix or a support for the color-changing material.

In at least one further embodiment of the invention the structured transparent conductive layer may be deposited on a transparent substrate. The structured transparent conductive layer or structured transparent elements may be used to apply an electric field in order to deposit or precipitate color-changing material on the structured transparent conductive layer on the substrate. Afterwards the transparent substrate may be attached to the transparent layer of the light source using for example a transparent adhesive, a light-curable transparent adhesive, or an index matching gel.

In at least one embodiment of the invention the structured luminescence conversion layer may be fabricated by volume casting, screen printing, inkjet printing, scratching, doctor blading, photolithography, laminating, or other suitable techniques.

Furthermore, light extraction elements can be fabricated by molding an uncured continuous layer or by photolithography. Luminescence conversion elements can be fabricated by volume casting, screen printing, inkjet printing, photolithography, and so on.

In at least one embodiment of the invention, an electroluminescent (EL) apparatus is disclosed comprising: a light source comprising a transparent layer capable of at least partially transmitting light out from said light source; and a structured luminescence conversion layer disposed over said transparent layer and on the exterior of said light source, said structured luminescence conversion layer comprising color-changing regions and non-color-changing regions, said color-changing regions absorbing a first spectrum of light from said light source and emitting a second spectrum of light, said second spectrum of light combining with the non-absorbed spectrum of light from said light source to give a total output spectrum of light for said electroluminescent apparatus.

In at least one embodiment of the invention, an electroluminescent (EL) apparatus is disclosed comprising: a light source comprising a transparent layer capable of at least partially transmitting light out from said light source; and a multi-element light extraction and luminescence conversion layer disposed over said transparent layer and on the exterior of said light source, said multi-element light extraction and luminescence conversion layer comprising a plurality of light extraction elements and a plurality of luminescence conversion elements, wherein said light extraction elements diffuses said light from said light source and further wherein said luminescence conversion elements absorbs a first spectrum of light from said light source and emits a second spectrum of light, further wherein said non-absorbed first spectrum of light, said second spectrum of light and said diffused light output due to said light extraction element forms a total output spectrum of light for said electroluminescent apparatus, said elements adjacent to one another and adjacent directly to said transparent layer.

In further embodiments of the invention also any possible combination or combinations of the disclosed embodiments and features are included.

FIG. 1 shows a cross-sectional view of an embodiment of an electroluminescent (EL) apparatus 200 according to at least one embodiment of the invention. The EL apparatus 200 includes an OLED device 205 and a structured luminescence conversion layer 230. OLED device 205 includes a substrate 208 and a first electrode 211 on the substrate 208. The first electrode 211 may be patterned for pixilated applications or un-patterned for backlight or other general lighting applications. The OLED device 205 also includes a semiconductor stack 214 on the first electrode 211. The semiconductor stack 214 includes at least the following: (1) an anode buffer layer (ABL) 215 and (2) an active light emitting layer (EML) 216.

As shown in FIG. 1, the OLED device 205 is a bottom-emitting device. As a bottom-emitting device, the first electrode 211 acts as an anode, and the ABL 215 is deposited onto the first electrode 211, and the EML 216 is deposited onto the ABL 215. Finally, the OLED device 205 also includes a second electrode 217 deposited onto the organic semiconductor stack 214. Other layers than that shown in FIG. 1 may also be added such as insulating layers, barrier layers, electron/hole injection and blocking layers, getter layers, and so on. In particular an encapsulation of the OLED device 205 with one or more layers like for example planarization layers, moisture and/or oxygen absorbing layers, and barrier layers may be added in order to protect the OLED device.

In accordance with the invention, a structured luminescence conversion layer 230 is deposited on the outside of the OLED device 205. More specifically, in the configuration shown, the structured luminescence conversion layer 230 is deposited on the substrate 208. The OLED device 205 and the structured luminescence conversion layer 230 together comprise the EL apparatus 200. Exemplary embodiments of these layers are described in greater detail in the following.

Substrate 208:

The substrate 208 can be any material, which can support the additional layers and electrodes. In case of a bottom-emitting OLED the substrate may be transparent or semi-transparent to the wavelength of light emitted by the OLED device 205. Preferable substrate materials include glass, quartz, and plastic, preferably, thin, flexible glass. The preferred thickness of the substrate 208 depends on the material used and on the application of the device. The substrate 208 can be in the form of a sheet or continuous film. The continuous film is used, for example, for roll-to-roll manufacturing processes which are particularly suited for plastic, metal, and metallized plastic foils.

First Electrode 211:

In the bottom-emitting configuration, the first electrode 211 functions as an anode (the anode is a conductive layer which serves as a hole-injecting layer). Typical anode materials include metals (such as platinum, gold, palladium, indium, and the like); conductive oxides (such as lead oxide, tin oxide, indium-tin oxide (ITO), and the like); graphite; and doped conducting polymers (such as polyaniline, polypyrrole, polythiophene, and the like). Preferably, the first electrode 211 comprises indium-tin oxide (ITO).

For OLEDS, the first electrode layer 211 is usually thin enough so as to be transparent or at least semi-transparent and allow at least a fraction of light to transmit through (in bottom emitting OLEDs). The thickness of the first electrode 211 is from about 10 nm to about 1000 nm, preferably, from about 50 nm to about 200 nm, and more preferably, is about 100 nm. As such, any thin-film deposition method may be used in the first electrode fabrication step. These include, but are not limited to, vacuum evaporation, sputtering, electron beam deposition, chemical vapor deposition, etching and other techniques known in the art and combinations thereof. The process also usually involves a baking or annealing step in a controlled atmosphere to optimize the conductivity and optical transmission of anode layer. Photolithography can then be used to define any pattern, if desired, upon the first electrode 211.

ABL 215:

The ABL 215 has good hole conducting properties and is used to effectively inject holes from the first electrode 211 to the EML 216. The ABL 215 comprises or is made of polymers or small molecule materials or other material. For example, the ABL 215 can be made from tertiary amine or carbazole derivatives both in their small molecule or their polymer form, conducting polyaniline ("PANI"), or PEDOT:PSS, a solution of poly-(3,4-ethylenedioxythiophene) ("PEDOT") and polystyrenesulfonic acid ("PSS") (available for example as "Baytron P" from HC Starck). The ABL 215 can have a thickness from about 5 nm to about 1000 nm, and is conventionally used from about 50 to about 250 nm. Other examples of the ABL 215 include copper phthalocyanine (CuPc) films with preferred thicknesses between 10 and 50 nm. Other such examples of ABL materials are well-known in the art and can readily be substituted for or combined with the above-mentioned materials.

The ABL 215 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating.

EML 216:

The active light emitting layer (EML) 216 comprises an organic electroluminescent material which emits light upon application of a potential across first electrode 211 and second electrode 217. The EML may be fabricated from organic or organo-metallic materials, and may include polymer, monomer, or small molecule emitters or combinations or mixtures thereof. As used herein, the term organic also includes organo-metallic materials. Light emission in these materials may be generated as a result of fluorescence and/or phosphorescence.

Organic materials may comprise one or more of a polymer, polymer blend, monomer, oligomer, co-polymer, an organic side-group, small molecule or blend of any of these. The EML 216 can comprise for example conjugated EL polymers, such as polyfluorenes, polythiophenes, polyphenylenes, polythiophenevinylenes, polyspiro polymers, or poly-p-phenylenevinylenes or their families, copolymers, derivatives, blends, or mixtures thereof that emit ultraviolet, blue, green, yellow, orange, red, infrared, white, or any single or combined spectrum of light.

The EML 216 can be a continuous film that is non-selectively deposited (e.g. spin coating, dip coating, spray coating, web coating, etc.) or discontinuous regions that are selectively deposited (e.g. by ink-jet printing, flex printing, or screen printing). EML 216 may also be fabricated by vapor deposition, sputtering, vacuum deposition, etc. as desired.

The EML 216 can include more than one light emitting element (for instance, a host and a dopant). In the case of two light-emitting elements, the relative concentration of the host element and the dopant element can be adjusted to obtain the desired color. The EML 216 can emit light in any desired color and be comprised of polymers, co-polymers, dopants, quenchers, and hole and electron transport materials as desired. For instance, the EML 216 can emit light in ultraviolet, blue, red, green, orange, yellow or any desired combination of these colors and in some applications, may include a combination of emitting elements which produce white light. The EML 216 may also comprise a plurality of separate emissive sub-layers.

In addition to active electroluminescent materials that emit light, EML 216 can also include materials capable of charge transport. Charge transport materials include polymers or small molecules that can transport charge carriers, for example organic materials such as polythiophene, derivatized polythiophene, oligomeric polythiophene, derivatized oligomeric polythiophene, pentacene, triphenylamine, and triphenyldiamine.

Second Electrode 217:

In the bottom-emitting configuration, the second electrode 217 functions as the cathode (i.e. as the conductive layer which serves as an electron-injecting layer and which is comprised of a material with a low work function). While many materials, which can function as a cathode, are known to those of skill in the art, most preferably a composition that includes aluminum, indium, silver, gold, magnesium, calcium, lithium, lithium fluoride, cesium fluoride, sodium fluoride, and barium, or combinations thereof, or alloys thereof, is utilized. Aluminum, combinations of calcium and aluminum, barium and aluminum, lithium fluoride and aluminum, lithium fluoride with calcium and aluminum, magnesium and silver, or their alloys are especially preferred.

Preferably, the thickness of second electrode 217 is from about 10 nm to about 1000 nm, more preferably from about 50 nm to about 500 nm, and most preferably from about 100 nm to about 300 nm. While many methods are known to those of ordinary skill in the art by which the first electrode material may be deposited, vacuum deposition methods, such as thermal vacuum evaporation, sputtering or electron-beam deposition are preferred.

Additionally the second electrode 217 may function as a mirror or may include an additional mirror layer in order to reflect light, which is produced in the EML 216 and emitted away from the transparent substrate 208, towards the substrate 208.

Other layers (not shown) such as a barrier layer and getter layer may also be used to protect the electronic device. Such layers are well-known in the art and are not specifically discussed herein.

Structured Luminescence Conversion Layer 230:

OLED device 205 as shown is a bottom-emitting OLED, and thus, the light emitted from the EML 216 passes through the substrate 208. In accordance with various embodiments of the invention, a structured luminescence conversion layer 230 is deposited on the exposed external side of the substrate 208 (and thus, on the exterior of the OLED device 205) to modify and tune the light output from EL apparatus 200. In at least one embodiment of the invention, the structured luminescence conversion layer is composed of first color-changing regions 230A and second, non-color-changing regions 230B. The first color-changing regions 230A together form a pattern or "structure" for the structured luminescence conversion layer 230 which is distinguishable from uniform down conversion layers (where the entire layer has color-changing materials) used in conventional electroluminescent devices. The structure of the structured luminescence conversion layer in accordance with various embodiments of the invention may be striped, cross-striped (meshed), circular, square (checkered) or any geometry in configuration. Exemplary structures are illustrated in FIGS. 4A-4F.

The various color-changing regions 230A are separated by the various non-color-changing regions 230B. The non-color-changing regions 230B may be completely empty or may comprise of a non-absorbing, light emitting or light transmitting material (such as glass). The color-changing regions 230A will each comprise fluorescent or phosphorescent material or any color changing material which can absorb light in one spectrum and emit light in another spectrum. The color-changing material within the color-changing regions 230A may be embedded in a transparent matrix. All of the color-changing regions 230A in the structured luminescence conversion layer 230 can be of the same material or can be different material. For instance, one portion of the color-changing regions 230A may be orange emitting while another portion is yellow emitting. The ratio of the color-changing regions 230A versus non-color-changing regions 230B affects the output spectrum of the EL apparatus. Due to the addition of this ratio, the use of a structured conversion layer gives greater flexibility in designing the output spectra than when uniform conversions layers are used. The flexibility enables finding a better compromise between efficiency and color rendering.

Exemplary color-changing materials which could be used in forming the color-changing regions 230A include, but are not limited to, organic and inorganic dyes, cerium doped garnets, nitride phosphors, ionic phosphors like $SrGa_2S_4$:$Eu^{2+}$ or $SrS$:$Eu^{2+}$, quantum dots, fluorescent dyes or conjugated polymers. The color-changing material in each case can be dissolved or blended into transparent matrix materials such as silicone, epoxy, adhesives, polymethylmethacrylate, polycarbonate and so on.

The thickness of the structured luminescence conversion layer 230 depends on the desired output spectrum of the device and the concentration of the color-changing material in the structured luminescence conversion layer 230. The concentration of the color-changing material may be limited by quenching and aggregation effects. Furthermore, scattering effects, in particular backscattering, are dependent on the concentration of the color-changing material. In order to reduce such effects particle sizes of the color-changing material of at least 1500 nanometers or effectively at most 300 nanometers may be advantageous.

The concentration of the color-changing material may be such that the photon saturation limit is not reached. In this case the spectrum of the emitted light of the EL apparatus 200 may be given by the spectrum of the part of the light that is emitted by the OLED 205 and that passes through the non-color-changing regions 230B and that passes unconverted through the color-changing regions 230A, and the spectrum of the part of the light that is emitted by the OLED 205 and that is converted to another wavelength in the color-changing regions 230A.

Alternatively, the concentration of the color-changing material may be such that the photon saturation limit is reached or even exceeded. In this case the spectrum of the emitted light of the EL apparatus 200 may be given by the spectrum of the part of the light that is emitted by the OLED 205 and that passes through the non-color-changing regions 230B, and the spectrum of the part of the light that is emitted by the OLED and that is converted to another wavelength in the color-changing regions 230A.

For example the light source emits blue light and the color-changing regions 230A absorb the light emitted by the light source and emit in the yellow range of wavelengths, while the photon saturation limit is not reached. Depending on the surface ratio of color-changing regions 230A and non-color-changing regions 230B, the concentration of color-changing material in the color-changing regions 230A, and the thickness of the color-changing regions 230A the emission spectrum of EL apparatus 200 may be adjusted to be any mixture of blue and yellow light and may preferably appear white.

Alternatively the color-changing regions include color-changing material that emits red light and other color-changing material that emits green light. In this case the emission spectrum of EL apparatus 200 may preferably appear warm-white.

In case the photon saturation limit is reached or even exceeded in the color-changing regions 230A the output spectrum of the EL apparatus 200 will be rather independent of small concentration variations of the color-changing material and the thickness of the color-changing regions 230A and may depend only on the surface ratio of color-changing regions 230A and non-color-changing regions 230B.

In some embodiments, the structured luminescence conversion layer 230 can be attached to the substrate 208 using an optically adhesive glue, which may additionally also be curable by ultraviolet radiation, or an index matching gel.

For example the color-changing regions can be included in a foil whereas the non-color-changing regions remain empty or are formed by transparent foil.

In other embodiments, the structured luminescence conversion layer 230 can be deposited or formed directly on substrate 208 by screen printing, ink-jet printing, electrophoresis, or other selective deposition techniques or masking combined with non-selective or selective deposition techniques. Further, the structured luminescence conversion layer 230 can utilize a cross-linkable material which can then be chemically bonded to the substrate 208.

FIGS. 2A and 2B show a perspective and a cross-sectional view of an exemplary EL apparatus in accordance with at least one embodiment of the invention. EL apparatus 308 comprises a light source 305 and a structured luminescence conversion layer 330. Layer 330 has a plurality of color-changing regions 330A and non-color-changing regions 330B. The non-color-changing regions 330B are shown as empty regions.

The width of the non-color-changing regions is "b" while the width of the color-changing regions is "a". The ratio between "a" and "b" would determine the output spectrum as described for this particular embodiment in equation 2 above (where "b" is 1-x and "a" is x). In reference to equation 2, the thickness of the structured luminescence conversion layer 330 is δ. As shown, the thickness is uniform over the structured luminescence conversion layer 330, however, in other embodiments, the thickness may be varied from one color-changing region to another or varied within even a given color-changing region. Equation 2 above assumes a uniform thickness value δ. The color-changing regions 330A absorb certain spectra of light emitted from light source 305 and emit other spectra of light. The non-color-changing regions 330B pass through the light emitted from light source 305 without spectral modification. The non-color-changing regions 330B may also comprise an actual material rather than an empty or void space. For instance, the non-color-changing regions 330B may comprise an optical adhesive or glass or similar light transmissive material.

Figure 3A:
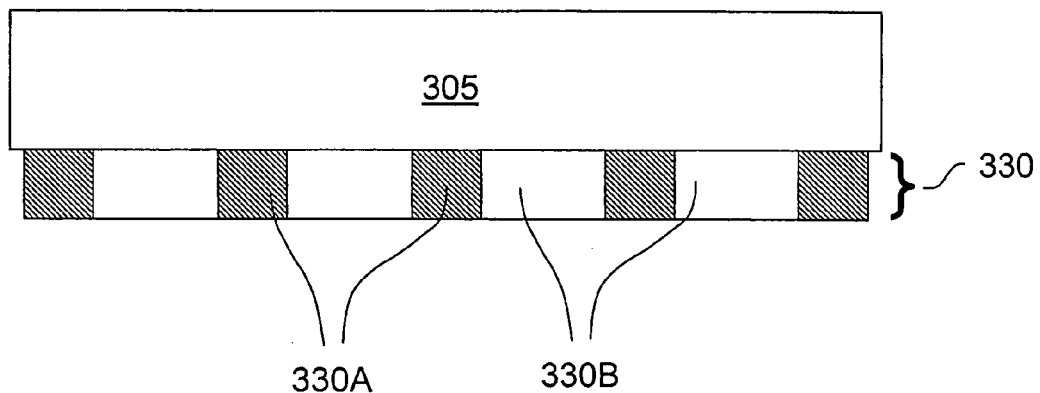
FIGS. 3A-3B show cross-sectional views of exemplary EL apparatus according to embodiments of the invention.

FIG. 3A shows a cross-sectional view of a further exemplary EL apparatus in accordance with at least one embodiment of the invention. EL apparatus 309 comprises a light source 305 and a structured luminescence conversion layer 330. Layer 330 has plurality of first color-changing regions 330A and a plurality of second color-changing regions 330B. The first color-changing regions 330A comprise color-changing material that converts the light emitted by light source 305 in a range of wavelengths that is different from the range of wavelengths the light emitted by the light source 305 is converted in by color-changing material in the second color-changing regions 330B.

It may be advantageously if the photon saturation limit is not reached by the first color-changing regions 330A or by the second color-changing regions 330B. For example the light source 305 may emit mainly blue light and the first color-changing regions 330A may convert a part of the blue light into red light while the second color-changing regions 330B may convert a part of the blue light into green light, while the photon saturation limit is not reached in the color-changing regions 330A and 330B. Depending on the concentrations of the color-changing materials in the first color-changing regions 330A and the second color-changing regions 330B and the thicknesses of the first color-changing regions 330A and the second color-changing regions 330B any mixture of blue, red, and green light can be produced which may provide a variety of light-emission spectra including white. The concentrations of color-changing materials can be the same in each of the first color-changing regions 330A and/or in each of the second color-changing regions 330B or can be different between color-changing regions or may vary the same color-changing region.

Although in FIG. 3A the thickness of all color-changing regions is the same the thicknesses of individual color-changing regions can be different from other thicknesses or even can vary within a color-changing region.

Alternatively, in the first color-changing regions 330A and in the second color-changing regions 330B the photon saturation limit is reached or even exceeded. This implies that mainly only converted light is emitted by the EL apparatus 309. Depending on the ratio of surfaces occupied by the first color-changing regions 330A and by the second color-changing regions 330B a fixed emission spectrum of the EL apparatus can be obtained.

For example the light source 305 may emit mainly blue light and the first color-changing regions 330A may convert blue light into red light while the second color-changing regions 330B may convert blue light into green light. Depending on the surface ratio of the first color-changing regions 330A, the second color-changing region 330B, and the non-color-changing regions 330C any mixture of red and green light can be produced which may provide a variety of light-emission spectra. Due to the fact that in both the first color-changing regions 330A and in the second color-changing regions 330B the photo saturation limit is reached the emission spectrum of the EL apparatus 309 is rather independent of small variations of the thickness of individual color-changing regions and the concentrations of color-changing materials in the individual color-changing regions. Therefore such a device allows a high reproducibility considering its output spectrum with moderate requirements in the production process.

Alternatively, regions 330B are non-color-changing regions. EL apparatus 309 is in principle similar to EL apparatus 200 described in FIG. 1, whereas the non-color-changing regions 330B are filled with a transparent, non-color-changing material that does not alter the spectrum emitted by light source 305. For instance the non-color-changing material may include silicone, epoxy or acrylic resin, polypropylene, polyethylene, polymethylmethacrylate, and/or polycarbonate. Additionally color-changing regions 330A may include the transparent, non-color-changing material which serves as a matrix material for color-changing material which may be dissolved in, mixed with, or otherwise blended in the matrix material. Using the non-color-changing material for non-color-changing regions 330B and as matrix material for color-changing regions 330A may improve the stability of the structured luminescence conversion layer 330A as well as the adhesion of the structured luminescence conversion layer 330 to the light source 305. This may be advantageously in particular when EL apparatus 309 is a flexible, large-area lighting apparatus.

Figure 3B:
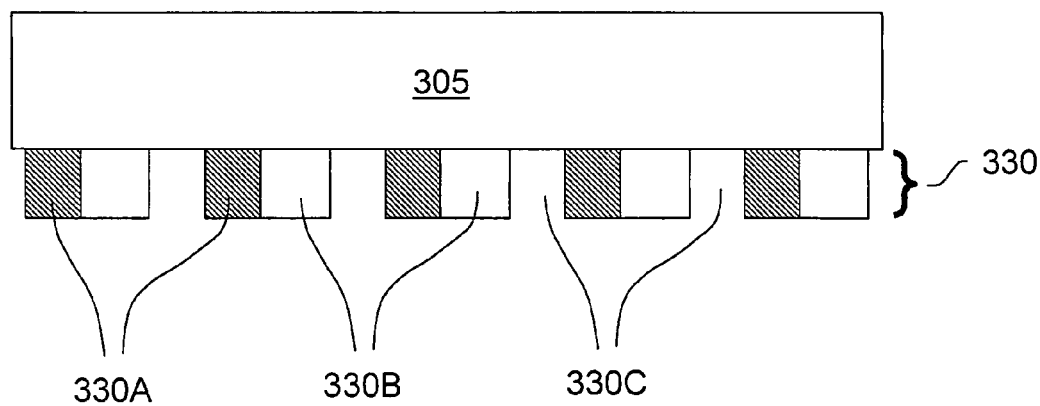

FIG. 3B shows a cross-sectional view of a further exemplary EL apparatus in accordance with at least one embodiment of the invention. EL apparatus 310 comprises a light source 305 and a structured luminescence conversion layer 330. Layer 330 has a plurality of first color-changing regions 330A, a plurality of second color-changing regions 330B, and a plurality of non-color-changing regions 330C. The first color-changing regions 330A comprise color-changing material that converts the light emitted by light source 305 in a range of wavelengths that is different from the range of wavelengths the light emitted by the light source 305 is converted in by color-changing material in the second color-changing regions 330B.

Although in FIG. 3B the non-color-changing regions 330C are shown empty the non-color-changing regions 330C may be filled with transparent material as for instance silicone, epoxy or acrylic resin, glass, or any other suitable transparent material or combinations or mixtures thereof. Preferably the photon saturation limit is reached or even exceeded in both the first color-changing regions 330A an in the second color-changing regions 330B. Independent of small variations of color-changing material in the color-changing regions and of small variation in the thicknesses of the color-changing regions the output spectrum is mainly given by the part of the surface of the luminescence conversion layer 330 that is occupied by the first color-changing regions 330A, the second color-changing regions 330B and the non-color-changing regions 330C.

Alternatively, photon saturation limit is reached or even exceeded only in the first color-changing regions 330A or only in the second color-changing regions 330B.

FIGS. 4A-4F illustrate exemplary patterns for structured luminescence conversion layers from a top view.

FIG. 4A shows a striped pattern or structure 701 for the structured luminescence conversion layer. The color-changing regions 730A are shaded while the non-color-changing regions 730B are blank. This pattern would correspond, for instance, to the cross-sectional view of the structured luminescence conversion layer 330 shown in FIGS. 2A and 2B.

Alternatively, the shaded regions may represent first color-changing regions 730A and the blank regions represent second color-changing regions 730B, corresponding for instance to the cross-sectional view of the structured luminescence conversion layer 330 shown in FIG. 3A.

FIG. 4B shows a mesh pattern or structure 702 where color-changing regions 730A are formed by crossing and partially overlapping stripes. In this case, the regions 730B are square in geometry (from a top view) and may be non-color-changing regions or further, e.g. second, color-changing regions. Alternatively, striped regions 730A may be non-color-changing regions and regions 730B color-changing regions.

FIG. 4C shows a circular pattern or structure 703 for the structured luminescence conversion layer. One example of this pattern would be cylindrical color-changing regions 730A which are formed by deposition which dries into a drop shaped film. Regions 730B may be non-color-changing regions or may be further, e.g. second, color changing regions. Alternatively, regions 730A may be non-color-changing regions while regions 730B are color-changing regions. Further, circular shaped regions 730A may be for instance also elliptical.

FIG. 4D shows a checkered pattern or structure 704 where color-changing regions 730A and non-color-changing regions 730B alternate in squares. Alternatively regions 730B may be further, e.g. second, color-changing regions.

FIG. 4E shows a pattern or structure 705 with first color-changing regions 730A, second color-changing regions 730B, and non-color-changing region 730C. Regions 730A and 730B are shown as circularly shaped regions but may be also of any other shape or relative size.

FIG. 4F shows a striped pattern or structure 706 with first color-changing regions 730A, second color-changing regions 730B, and non-color-changing regions 730C. This pattern would correspond, for instance, to the cross-sectional view of the structured luminescence conversion layer 330 shown in FIG. 3B.

The patterns shown in FIGS. 4A-4F are merely exemplary of the possible patterns or structures for the structured luminescence conversion layer and are not intended to be limiting or exhaustive. Though shown in repeating patterns, the structured luminescence conversion layer may also have random or non-repeating or partially repeating color-changing and non-color-changing regions. Furthermore, as mentioned above the thicknesses of color-changing regions as compared to one another may vary. Also, the thickness of single discrete color-changing region across its width may vary. For example, a color-changing region that is the result of a dried solution drop will be thicker in certain places (for instance in the center of the drop) and likely less thick towards the outer edges.

Figure 5:
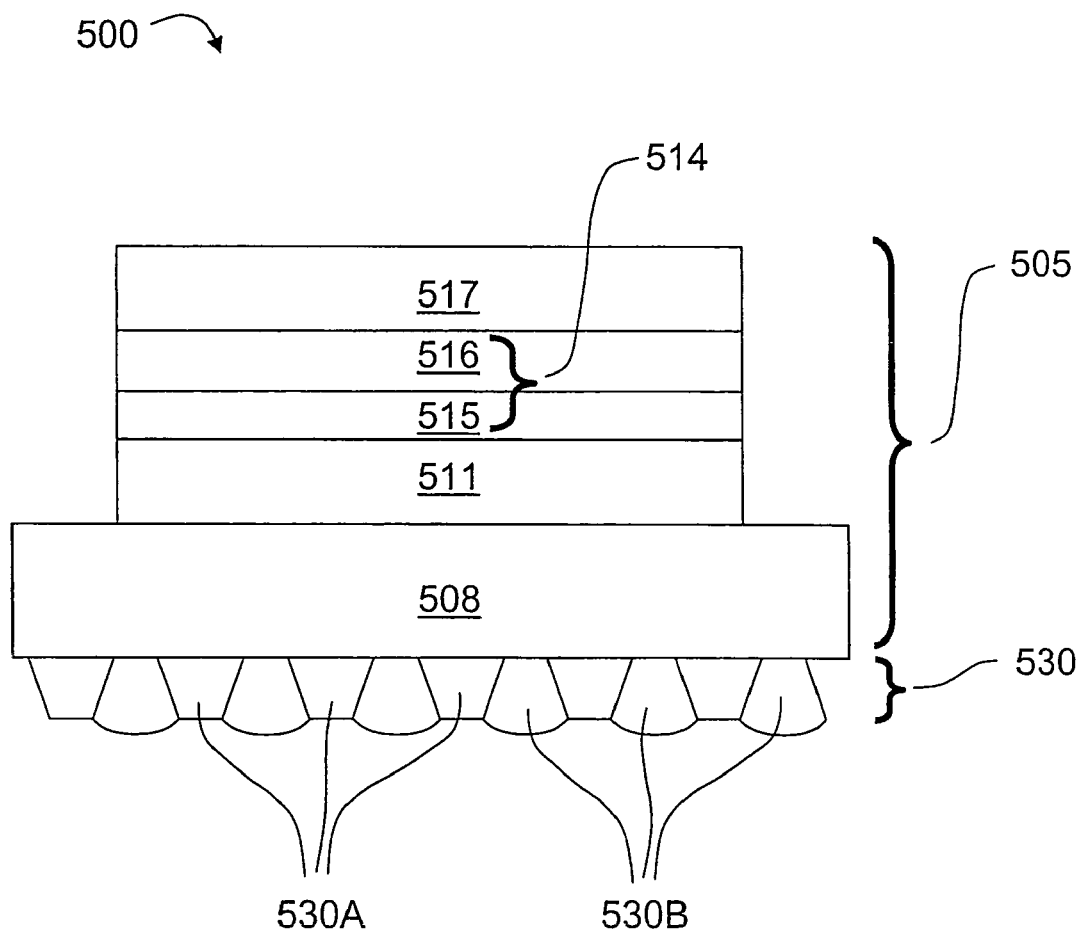
FIG. 5 shows a cross-sectional view of another embodiment of an EL apparatus according to at least one embodiment of the invention.

FIG. 5 shows a cross-sectional view of an embodiment of an electroluminescent (EL) apparatus 500 according to at least one embodiment of the invention. The EL apparatus 500 includes an OLED device 505 and a structured luminescence conversion layer 530 which is formed as a multi-element light extraction and luminescence conversion (MLELC) layer. OLED device 505 includes a substrate 508 and a first electrode 511 on the substrate 508. The first electrode 511 may be patterned for pixilated applications or un-patterned for backlight or other general lighting applications. The OLED device 505 also includes a semiconductor stack 514 on the first electrode 511. The semiconductor stack 214 includes at least the following: (1) an anode buffer layer (ABL) 515 and (2) an active light emitting layer (EML) 516.

As shown in FIG. 5, the OLED device 505 is a bottom-emitting device. As a bottom-emitting device, the first electrode 511 acts as an anode, and the ABL 515 is deposited onto the first electrode 511, and the EML 516 is deposited onto the ABL 515. Finally, the OLED device 505 also includes a second electrode 517 deposited onto the organic semiconductor stack 514. Other layers than that shown in FIG. 5 may also be added such as insulating layers, barrier layers, electron/hole injection and blocking layers, getter layers, and so on. In particular, an encapsulation of the OLED device 505 with one or more layers like for example planarization layers, moisture and/or oxygen absorbing layers, and barrier layers may be added in order to protect the OLED device. The OLED device 505 is similar to the OLED device 205 shown in FIG. 1. The various embodiments of elements of OLED 205, i.e. substrate 208, first electrode 211, ABL 215, EML 216, and second electrode 217, explained in greater detail above refer also to the elements of OLED 505, i.e. to substrate 508, first electrode 511, ABL 515, EML 516, and second electrode 217, respectively.

In accordance with the invention, the MLELC layer 530 is deposited on the outside of the OLED device 505. More specifically, in the configuration shown, the MLELC layer 530 is deposited on the substrate 508. The OLED device 505 and the MLELC layer 530 together comprise the EL apparatus 500. Exemplary embodiments of the MLELC layer are described in greater detail in the following.

Multi-element Light Extraction and Luminescence Conversion (MLELC) Layer 530:

OLED device 505 as shown in FIG. 4 is a bottom-emitting OLED, and thus, the light emitted from the EML 516 passes through the substrate 508. In accordance with various embodiments of the invention, a multi-element light extraction and luminescence conversion (MLELC) layer 530 is deposited on the exposed external side of the substrate 508 (and thus, on the exterior of the OLED device 505) to modify and tune the light output from EL apparatus 500.

In at least one embodiment of the invention, the MLELC layer 530 comprises at least one light extraction element(s) 530A and at least one luminescence conversion element(s) 530B.

Each luminescence conversion element 530B comprises at least one color-changing region comprising a fluorescent or phosphorescent material or any color-changing material which can absorb light in one spectrum and emit light in another spectrum. Preferably a luminescence conversion element 530B is a color-changing region. The color-changing material within the color-changing region(s) of the luminescence conversion element(s) 530B may be embedded in a transparent matrix. All of the luminescence conversion element(s) 530B can be of the same material or can be different material. For instance, a portion of luminescence conversion element(s) 530B may be orange emitting while another portion may be yellow emitting. Exemplary color-changing materials which could be used in forming the luminescence conversion element(s) 530B include, but are not limited to, scattering particles, organic and inorganic dyes, cerium doped garnets, nitride phosphors, ionic phosphors like $SrGa_2S_4:Eu^{2+}$ or $SrS:Eu^{2+}$, quantum dots, fluorescent dyes or conjugated polymers. The color-changing materials in each case can be dissolved or blended into transparent matrix materials such as silicone, epoxy, adhesives, polymethylmethacrylate, polycarbonate and so on. The shape/geometry of the luminescence conversion element(s) 530B can be flat or lens-like, or any desirable shape.

The light extraction element(s) 530A can comprise materials that have a refractive index roughly equal to the transparent layer of the OLED or light source to which it is attached. In the embodiment shown in FIG. 5, light extraction element(s) 530A would have a refractive index that matches the refractive index of substrate 508 of OLED device 505. The light extraction element(s) 530A would also have a refractive index greater than or equal to the refractive index of the luminescence conversion element(s) 530B.

In one embodiment of the invention, the light extraction element(s) 530A would have no color-changing materials but rather comprise non-color-changing regions. Preferably in this case the light extraction elements 530A are non-color-changing regions. In alternate embodiments, the light extraction element(s) 530A may include color-changing materials. The shape/geometry of the light extraction element(s) 530A is trapezoidal or emboss in nature. The angles of the geometry for light extraction element(s) 530A will be designed so as to enhance out-coupling of light. Preferably, both the light extraction element(s) and the luminescence conversion element(s) comprise materials with a low absorption coefficient for the light emitted by the light source and the light emitted by the color-changing material, respectively.

The ratio of the surface area (or width or other dimension) of the luminescence conversion element(s) 530A versus the light extraction element(s) 530B affects the total output spectrum of the EL apparatus. Due to the addition of this ratio, the use of a multi-element light extraction and luminescence conversion layer gives greater flexibility in designing the output spectra than when uniform conversions layers are used. The flexibility enables finding a better compromise between efficiency and color rendering.

The thickness of the MLELC layer 530 varies as among the light extraction element(s) 530A and the luminescence conversion elements 530B. It depends on the desired output spectrum of the device and the concentration of the color-changing material in the luminescence conversion element(s) 530B. The concentration of the color-changing material may be limited by quenching and aggregation effects. Furthermore, scattering effects, in particular backscattering, are dependent on the concentration of the color-changing material. In order to reduce such effects particle sizes of the color-changing material of at least 1500 nanometers or effectively at most 300 nanometers may be advantageous.

In some embodiments, the MLELC layer 530 can be attached to the substrate 508 using an optically adhesive glue, which may additionally also be curable by ultraviolet radiation, or an index matching gel. In other embodiments, the MLELC layer 530 can be deposited or formed directly on substrate 508 by screen printing, inkjet printing or other selective deposition techniques or masking combined with non-selective deposition techniques. Further, the MLELC layer 530 can utilize a cross-linkable material which can then be chemically bonded to the substrate 508. More specifically, the light extraction element(s) 530A can be formed by molding an uncured layer(s), by a lithography process, or by other physical/chemical application or attachment. The luminescence conversion element(s) 530B can be fabricated by selective deposition techniques such as volume casting, inkjet printing, screen printing, shadow masking and so on.

FIG. 6 shows a cross-sectional view of an exemplary EL apparatus in accordance with at least one embodiment of the invention. EL apparatus 608 comprises a light source 605 and a structured luminescence conversion layer 630 formed as multi-element light extraction and luminescence conversion (MLELC) layer similar to MLELC layer 530 of FIG. 4. Layer 630 has at least one light extraction element(s) 630A and at least one luminescence conversion element(s) 630B. Preferably the light extraction element(s) 630A are non-color-changing regions and the luminescence conversion element(s) 630B are color-changing regions.

The width of the individual light extraction element(s) at the interface to the light source 605 is "a" while the width of the individual luminescence conversion element(s) at the interface to the light source 605 is "b". The ratio between "a" and "b" can be used to determine the output spectrum as described in equation 2 above (where "b" is 1-x and "a" is x). As shown, the physical thickness is uniform over the structured luminescence conversion layer 630 formed a MLELC layer, however, in other embodiments, the thickness may be varied from one luminescence conversion element to another or varied within even a given luminescence conversion element and may likewise vary as among the light extraction elements. The luminescence conversion element(s) 630B absorb a first spectrum of light emitted from light source 605 and emit a second spectrum of light. The light extraction element(s) 630B, as preferably being non-color-changing regions, pass through the light emitted from light source 605 without spectral color shift (no specific or little intended color change) but with enhanced output. For instance, the light extraction element(s) 630B may comprise an optical adhesive or glass or similar light transmissive material.

The shape, function and composition of the light extraction element(s) 630A and luminescence conversion element(s) 630B are similar to that described for light extraction element (s) 530A and luminescence conversion elements 530B of FIG. 5. The total light output and spectrum is a combination of the non-absorbed first spectrum of light, the emitted second spectrum of light and the effect of the light extraction due to the light extraction elements 630A.

Alternatively, in further embodiments of the invention according to FIGS. 5 and 6 the light-extraction element(s) may comprise second color-changing regions or may be second color-changing regions. The first and/or the second color-changing regions forming at least part of the luminescence conversion element(s) and the light extraction element(s), respectively, may reach or even exceed the photon saturation limit or may not reach the photon saturation limit.

Figure 7A:
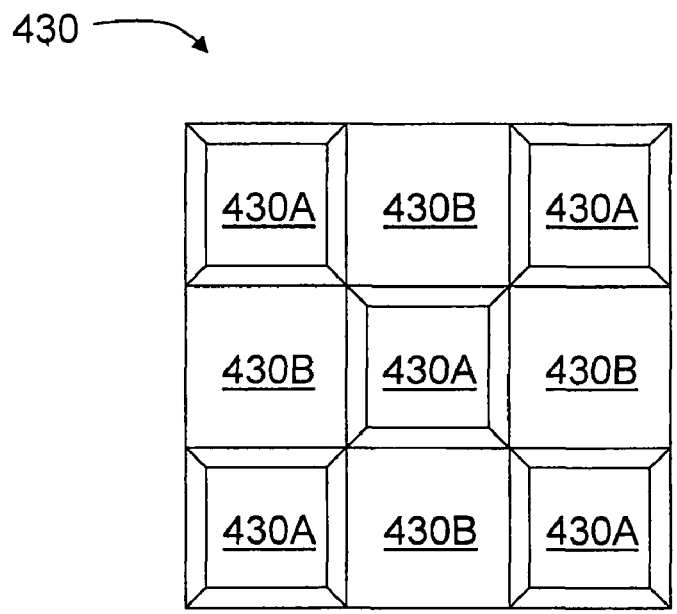
FIGS. 7A and 7B illustrate exemplary patterns for multi-element light extraction and luminescence conversion regions or layers from a top view.
Figure 7B:
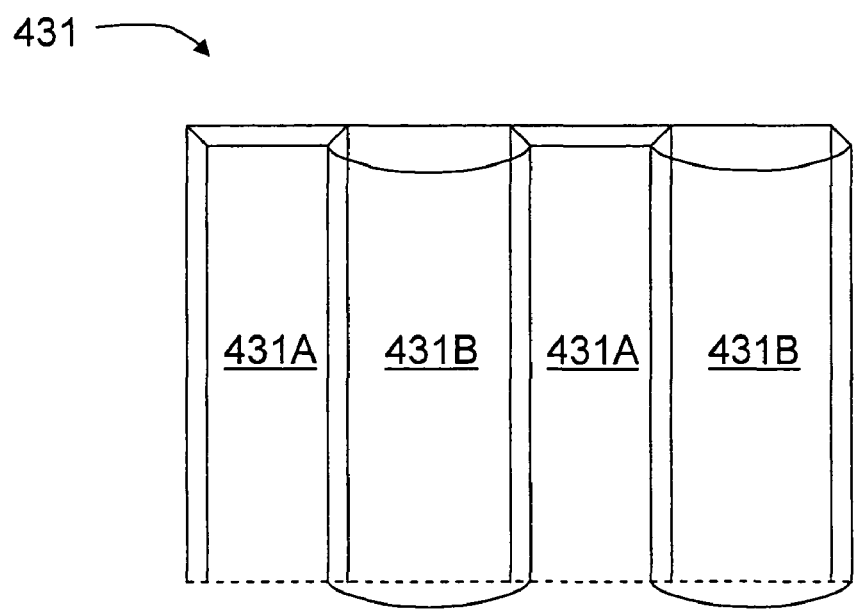

FIGS. 7A and 7B illustrate exemplary patterns for multi-element light extraction and luminescence conversion regions of a structured luminescence conversion layer from a top view. Further, the structured luminescence conversion layer may have only MLELC regions, i.e. the structured luminescence conversion layer is formed as a MLELC layer, so that the shown patterns may apply also to MLELC layers.

FIG. 7A shows a checkered pattern for a multi-element light extraction and luminescence conversion region or layer 430 where light extraction elements 430A and luminescence conversion elements 430B alternate in squares/rectangles across the top.

FIG. 7B shows a part of a striped pattern for a multi-element light extraction and luminescence conversion region or layer 431. The luminescence conversion elements 431A have a curved surface while the light extraction elements 431B are in an emboss shape or trapezoidal. This pattern would correspond, for instance, to the cross-sectional view of the multi-element light extraction and luminescence conversion layer 630 shown in FIG. 6.

Other alternate patterns not shown include a mesh pattern where the light extraction elements and luminescence conversion elements are stripes which overlap one another. Yet other patterns not shown include a circular pattern for the color-changing regions. One example of this pattern would be cut conical shapes for light extraction elements surrounded by color changing materials which comprise the luminescence conversion element(s).

The patterns shown in FIGS. 7A and 7B are merely exemplary of the possible patterns for multi-element light extraction and luminescence conversion regions or layers and are not intended to be limiting or exhaustive. Though shown in repeating patterns, the multi-element light extraction and luminescence conversion region or layer may also have random or non-repeating or partially repeating light extraction and luminescence conversion elements. Furthermore, as mentioned above the thicknesses of luminescence conversion elements or light extraction elements may not be uniform and as compared to one another may vary.

Top-emitting OLED Devices

In an alternative configuration for example to that shown in FIG. 1 and described above, the first electrode 211 functions as a cathode (the cathode is a conductive layer which serves as an electron-injecting layer and which comprises a material with a low work function). The cathode, rather than the anode, is deposited on the substrate 208 in the case of a top-emitting OLED. In this alternative configuration, the second electrode layer 217 functions as an anode (the anode is a conductive layer which serves as a hole-injecting layer and which comprises a material with work function greater than about 4.5 eV). The anode, rather than the cathode, is deposited on the semiconductor stack 214 in the case of a top-emitting OLED.

In embodiments where the OLED is "top-emitting" as discussed above, the anode may be made transparent or translucent to allow light to pass from the semiconductor stack 214 through the top of the device. In such cases, the structured luminescence conversion layer would be attached, bonded or cured to the anode 217 (or to a glass layer, lid, or cover or any other material and structure which encapsulates and protects the anode) rather than to the substrate 208 as with a bottom-emitting OLED shown in FIG. 1.

As the "top-emitting" configuration is not restricted to a certain structured luminescence conversion layer a similar "top-emitting" configuration could also be applied to an EL apparatus with a MLELC layer as structured luminescence conversion layer as for instance shown in FIG. 5 or to an EL apparatus with any other structured luminescence conversion layer.

The OLED lighting sources and displays produced from a combination or arrays of EL apparatus described earlier can be used within applications such as information displays, general, industrial and area lighting, telephones, printers, computer displays, televisions, and illuminated signs.

As any person of ordinary skill in the art of light-emitting device fabrication will recognize from the description, figures, and examples any combination of features and embodiments included in this document are also included as well as modifications and changes can be made to the embodiments of the invention without departing from the scope of the invention defined by the following claims.

What is claimed:

1. An electroluminescent apparatus, comprising:
   a light source comprising a transparent layer capable of at least partially transmitting light out from said light source; and
   a multi-element light extraction and luminescence conversion layer disposed over said transparent layer and on the exterior of said light source, said multi-element light extraction and luminescence conversion layer comprising a plurality of light extraction elements and a plurality of luminescence conversion elements, wherein each of said light extraction elements and each of said luminescence conversion elements forms a part of the outer surface of said multi-element light extraction and luminescence conversion layer away from said transparent layer; and
   wherein said light extraction elements diffuse said light from said light source and further wherein said luminescence conversion elements absorb a first spectrum of light from said light source and emit a second spectrum of light, further wherein said non-absorbed first spectrum of light, said second spectrum of light and said diffused light output due to said light extraction elements form a total output spectrum of light for said electroluminescent apparatus, said elements adjacent to one another and adjacent directly to said transparent layer.

2. The apparatus of claim 1, wherein said light extraction elements have a trapezoidal geometry or an emboss-type geometry.

3. The apparatus of claim 1, wherein said luminescence conversion elements have a lens-like or flat geometry.

4. The apparatus of claim 1, wherein said plurality of light extraction elements and said plurality of luminescence conversion elements are arranged in an alternating pattern.

5. The apparatus of claim 1, wherein said plurality of light extraction elements and said plurality of luminescence conversion elements are arranged in a striped pattern or in a meshed pattern.

6. The apparatus of claim 1, wherein said plurality of light extraction elements and said plurality of luminescence conversion elements are arranged such that said plurality of luminescence conversion elements are conically-sectioned.

7. The apparatus of claim 1, wherein said light extraction elements have a refractive index matching the refractive index of the transparent layer.

8. The apparatus of claim 1, wherein said light extraction elements have a refractive index greater than the refractive index of the luminescence conversion elements.

9. The apparatus of claim 1, wherein said light extraction elements comprise a non-absorbing, light transmissive material.

10. The apparatus of claim 1, wherein said luminescence conversion elements and said light extraction elements comprise of materials with a low absorption coefficient.

11. An electroluminescent apparatus comprising:
    a light source comprising a transparent layer capable of at least partially transmitting light out from said light source; and a structured luminescence conversion layer disposed over said transparent layer, said structured luminescence conversion layer comprising first color-changing regions and second regions different from said first color-changing regions, said first color-changing regions absorbing a first spectrum of light from said light source and emitting a second spectrum of light, said second spectrum of light combining with the spectrum of light from said second regions to give a total output spectrum of light for said electroluminescent apparatus, wherein the first color-changing regions are formed as a plurality of luminescence conversion elements, wherein the second regions comprise non-color-changing regions and the spectrum of light from said second regions, which is given by the light passed through the second regions, is the non-absorbed first spectrum of light, wherein the second regions are formed as a plurality of light extraction elements, the structured luminescence conversion layer forming a multi-element light extraction and luminescence conversion layer, and wherein said light extraction elements have a trapezoidal geometry or an emboss-type geometry.

12. The apparatus of claim 11, wherein the second regions comprise second color-changing regions, the second color-changing regions absorbing light with at least part of the first spectrum and emitting light with a third spectrum being different from the first spectrum and the second spectrum.

13. The apparatus of claim 12, wherein the second regions are second color-changing regions.

14. The apparatus of claim 12, wherein the first color-changing regions comprise color-changing material.

15. The apparatus of claim 14, wherein the second color-changing regions comprise color-changing material.

16. The apparatus of claim 11, wherein said structured luminescence conversion layer comprises color-changing material.

17. The apparatus of claim 16, wherein the color-changing material comprises at least one dye.

18. The apparatus of claim 17, wherein said dye or said color-changing material is organic.

19. The apparatus of claim 17, wherein said dye or said color-changing material is fluorescent and/or phosphorescent.

20. The apparatus of claim 16, wherein said first color-changing regions comprise at least one of an organic dye, an inorganic dye, perylene, coumarin, cerium doped garnets, nitride phosphors, ionic phosphors, fluorescent dyes, quantum dots or conjugated polymers.

21. The apparatus of claim 16, wherein the color-changing material comprises at least one of cerium doped garnets, orthosilicates, nitrides, oxynitride silicates, nitride silicates, ionic phosphors, perylene, coumarin, quantum dots, or conjugated polymers.

22. The apparatus of claim 16, wherein the color-changing material includes particles with a mean diameter of at most 300 nanometers.

23. The apparatus of claim 16, wherein the color-changing material includes particles with a mean diameter of at least 1500 nanometers.

24. The apparatus of claim 11, wherein the first color-changing regions reach or exceed the photon saturation limit.

25. The apparatus of claim 11, wherein the first color-changing regions do not reach the photon saturation limit.

26. The apparatus of claim 12, wherein the second color-changing regions reach or exceed the photon saturation limit.

27. The apparatus of claim 12, wherein the second color-changing regions do not reach the photon saturation limit.

28. The apparatus of claim 11, wherein the first color-changing regions comprise a transparent matrix material.

29. The apparatus of claim 12, wherein the second color-changing regions comprise a transparent matrix material.

30. The apparatus of claim 16, wherein said structured luminescence conversion layer comprises a transparent matrix material.

31. The apparatus of claim 30, wherein said transparent matrix material is at least one of silicone, epoxy resin, acrylic resin, polymethylmethacrylate, or polycarbonate.

32. The apparatus of claim 30, wherein said structured luminescence conversion layer is attached physically and/or chemically to said transparent layer.

33. The apparatus of claim 11, wherein said structured luminescence conversion layer is attached physically and/or chemically to said transparent layer.

34. The apparatus claim 11, wherein the first color-changing regions and the second regions are adjacent to each other and are laterally arranged.

35. The apparatus of claim 34, wherein the first color-changing regions are separated by the second regions.

36. The apparatus of claim 11, wherein the structured luminescence conversion layer comprises striped, cross-striped, circular-shaped, triangular-shaped, or square-shaped regions or a combination thereof.

37. The apparatus of claim 11, wherein said apparatus is part of a light source application.

38. The apparatus of claim 11, wherein said light source is an OLED device.

39. The apparatus of claim 38, wherein said transparent layer is at least one of an anode layer, a cathode layer, a substrate, and an encapsulation layer of said light source.

40. The apparatus of claim 11, wherein the apparatus is flexible.

41. The apparatus of claim 11, wherein the structured luminescence conversion layer is disposed on an exterior of said light source.

42. The apparatus of claim 11, wherein a ratio of a total area of all said first color-changing regions to a total area of all said second regions affects a total output spectrum of said apparatus.

43. An electroluminescent apparatus comprising:
a light source comprising a transparent layer capable of at least partially transmitting light out from said light source; and
a structured luminescence conversion layer disposed over said transparent layer, said structured luminescence conversion layer comprising first color-changing regions and second regions different from said first color-changing regions, said first color-changing regions absorbing a first spectrum of light from said light source and emitting a second spectrum of light, said second spectrum of light combining with the spectrum of light from said second regions to give a total output spectrum of light for said electroluminescent apparatus, wherein the first color-changing regions are formed as a plurality of luminescence conversion elements and the second regions are formed as a plurality of light extraction elements, the structured luminescence conversion layer forming a multi-element light extraction and luminescence conversion layer, and wherein said luminescence conversion elements have a lens-like geometry.

* * * * *

UNITED STATES PATENT AND TRADEMARK OFFICE
CERTIFICATE OF CORRECTION

PATENT NO. : 8,330,348 B2
APPLICATION NO. : 12/092075
DATED : December 11, 2012
INVENTOR(S) : Dirk Berben et al.

Page 1 of 1

It is certified that error appears in the above-identified patent and that said Letters Patent is hereby corrected as shown below:

<u>Column 24</u>
Line 18, Claim 34, delete "apparatus claim" and insert -- apparatus of claim --

Signed and Sealed this
Ninth Day of April, 2013

Teresa Stanek Rea
*Acting Director of the United States Patent and Trademark Office*